United States Patent [19]

Mori

[11] Patent Number: 5,001,308
[45] Date of Patent: Mar. 19, 1991

[54] MEMBRANE SWITCH

[75] Inventor: Kouichirou Mori, Furukawa, Japan

[73] Assignee: Alps Electric Co., Ltd., Japan

[21] Appl. No.: 187,263

[22] Filed: Apr. 28, 1988

[30] Foreign Application Priority Data

Jun. 15, 1987 [JP] Japan ............................ 62-90708[U]

[51] Int. Cl.$^5$ ............................................. H01H 13/70
[52] U.S. Cl. .................... 200/5 A; 200/292; 361/398; 439/77
[58] Field of Search ............... 200/5 A, 159 B, 292, 200/86 R; 361/398, 408, 411, 412, 416, 408, 414; 174/68.5; 439/77

[56] References Cited

U.S. PATENT DOCUMENTS

| | | | |
|---|---|---|---|
| 4,180,711 | 12/1979 | Hirata et al. | 200/5 A X |
| 4,373,124 | 2/1983 | Frame | 200/5 A X |
| 4,594,482 | 6/1986 | Saito et al. | 200/5 A |
| 4,607,147 | 8/1986 | Ono et al. | 200/159 B |
| 4,626,961 | 12/1986 | Ono et al. | 361/398 |

Primary Examiner—J. R. Scott
Attorney, Agent, or Firm—Guy W. Shoup; Paul J. Winters; Stephen L. Malaska

[57] ABSTRACT

A membrane switch comprises a pair of flexible sheets connected together with the respective inner surfaces thereof provided with contacts and terminals respectively connected to the contacts facing each other and spaced apart by a spacer, and an output flat cable held between the pair of flexible sheets with the leader lines thereof in electrical contact respectively with the terminals. One of the contacts is formed on the inner surface of one of the pair of flexible sheets by evaporation and etching. The rest of the contacts are formed on the inner surface of the other flexible sheet by evaporation and etching. A connecting film is formed over the periphery of the inner surface of at least one of the pair of flexible sheets. Portions of the connecting film corresponding to the terminals are formed of films of an electrically conductive adhesive or heat sealing material, and portions of the connecting film other than those corresponding to the terminals are formed of films of an electrically insulating adhesive or heat sealing material.

4 Claims, 3 Drawing Sheets

MEMBRANE SWITCH

BACKGROUND OF THE INVENTION

1. Field of the Invention

The present invention relates to a membrane switch for various input devices such as a touch panel coordinates input device.

2. Description of the Prior Art

The membrane switch has pairs of contacts each formed on the opposite surfaces of upper and lower sheets placed one over the other so that each pair of contacts are brought into contact with each other by pressing the upper sheet at a position corresponding to the pair of contacts. Such a membrane switch has been applied to the touch panel coordinates input device.

Referring to FIGS. 4 and 5, a conventional membrane switch generally comprises a switching unit 4 having an upper sheet 1 and a lower sheet 2 each formed of a flexible transparent synthetic resin sheet, such as a transparent polyester sheet, and placed one over the other with a spacer 3, such as a dot spacer, therebetween, and an output flat cable 5 through which signals are derived. An upper contact 6 is formed in a functional surface of the upper sheet 1 by etching an ITO ($In_2O_3$, $SnO_2$) film formed over the functional surface by an evaporation process in a desired pattern. Lower contacts 7 are formed likewise in a functional surface of the lower sheet 2. The upper sheet 1 is placed over the lower sheet 2 with the functional surface thereof carrying the upper contact 6 facing the functional surface of the lower sheet 2 carrying the lower contacts 7. The upper contact 6 is formed substantially over the entire area of the functional surface of the upper sheet 1. The lower contacts 7 are formed in a plurality of sections in the functional surface of the lower sheet 2. Normally, the upper contact 6 and the corresponding lower contacts 7 are spaced apart by the spacer 3. When the upper sheet 1 is pressed with a finger tip or a tip of a stick, the upper sheet 1 is caused to flex, so that the upper contact 6 is brought into contact with the corresponding lower contact 7 for switching operation. Terminals 8 and 9 are formed respectively in the respective functional surfaces of the upper sheet 1 and the lower sheet 2 so as to be connected respectively to the upper contact 6 and the lower contacts 7. The terminals 8 and 9 are connected respectively to leader lines 10 and 11. The output flat cable 5 is formed by printing the leader lines 10 and 11 respectively on the opposite surfaces of a base film 12, such as a polyester film. The output flat cable 5 is held between the upper sheet 1 and the lower sheet 2. The upper sheet 1 and the lower sheet 2 are joined adhesively along the respective peripheries thereof with a two-side adhesive tape 13 having a predetermined thickness so that a predetermined gap corresponding to the thickness of the two-side adhesive tape 13 is formed between the upper sheet 1 and the lower sheet 2.

The membrane switch thus formed is attached adhesively with a two-side adhesive tape 15 to a base plate 14, such as an acrylic plate or a glass plate. The base plate 14 carrying the membrane switch is mounted on an apparatus such as a CRT.

In a process for adhesively joining the upper sheet 1 and the lower sheet 2 with the adhesive tape 13, the adhesive tape 13 lined with a separating paper is applied to the upper sheet 1 or the lower sheet 2, then the separating paper is removed from the adhesive tape 13, and then the upper sheet 1 and the lower sheet 2 are joined together. However, removal of the separating paper from the adhesive tape 13 requires a very difficult and troublesome work in assembling the membrane switch increasing the assembling cost. Furthermore, since the adhesive tape 13 is used simply for adhesively joining the upper sheet 1 and the lower sheet 2, the output flat cable 5 needs to be held between the upper sheet 1 and the lower sheet 2 by another adhesive means, which also increases the steps of membrane switch assembling process.

SUMMARY OF THE INVENTION

Accordingly, it is an object of the present invention to provide a membrane switch comprising an upper sheet and a lower sheet respectively for carrying contacts, which can easily be joined together without using any two-side adhesive tape.

To achieve the object of the invention, the present invention provides a membrane switch comprising a pair of sheets carrying contacts and leader lines on the respective functional surfaces thereof and adhesively joined together with the respective functional surfaces facing each other and with a predetermined space therebetween by a heat sealing layer formed between the pair of sheets and having an insulating heat sealing section formed in an area other than an area corresponding to an area in which leader lines are formed, and a conductive heat sealing section formed in the area corresponding to the area in which leader lines are formed.

The heat sealing layer having the insulating heat sealing section and the conductive heat sealing section is formed over the surface of one of the pair of sheets, for example, by printing, an output flat cable and the other sheet is placed properly on the former sheet, and then the pair of sheets are heated under pressure. Thus, the membrane switch can easily be assembled by simultaneously joining together the pair of sheets and the output flat cable. The heat sealing layer is formed in an appropriate thickness to provide a desired space between the pair of sheets. Naturally, the heat sealing layer may be used also as a spacer.

BRIEF DESCRIPTION OF THE DRAWINGS

The above and other objects, features and advantages of the present invention will become apparent from the following description taken in conjunction with the accompanying drawings, in which.

DESCRIPTION OF THE PREFERRED EMBODIMENT

Figure 1:
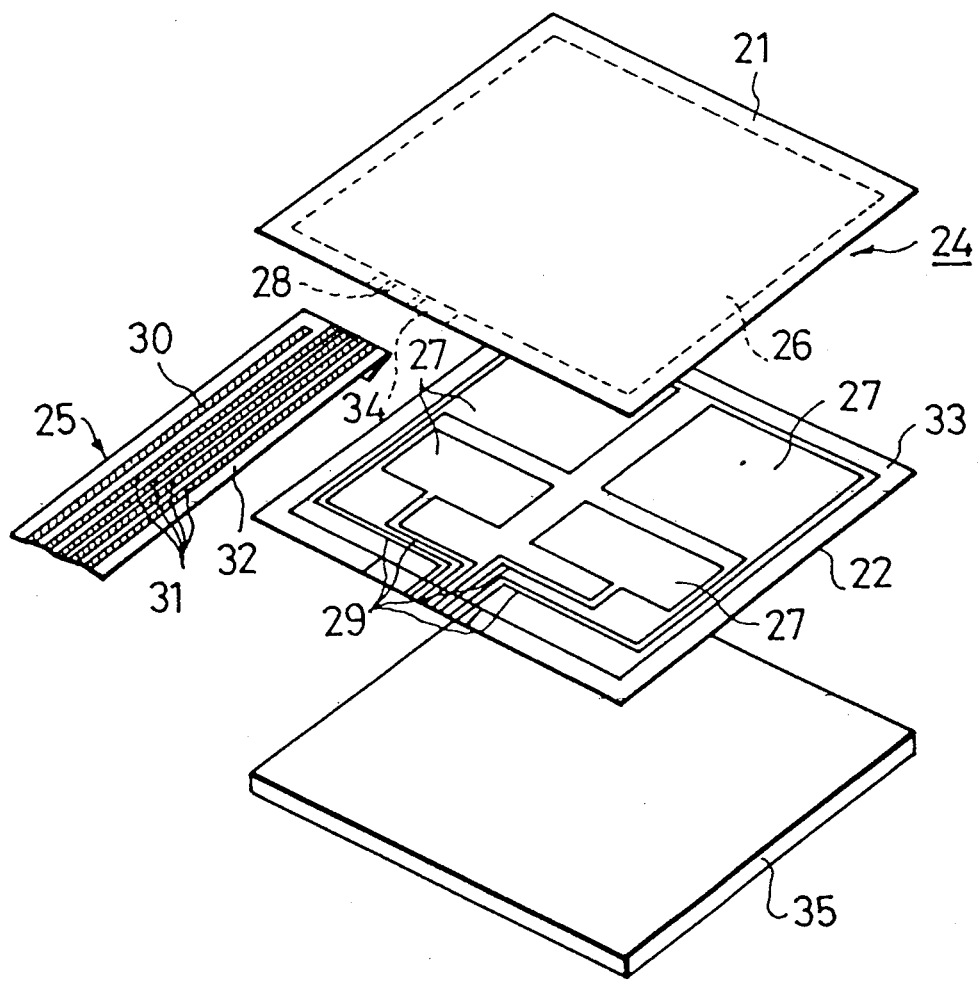
FIG. 1 is an exploded perspective view of a membrane switch, in a preferred embodiment, according to the present invention.
Figure 2:
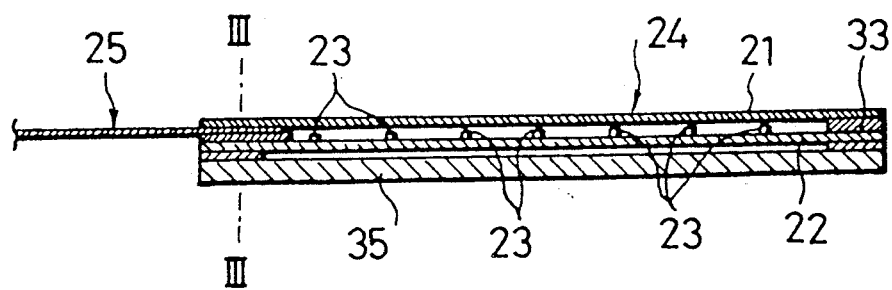
FIG. 2 is a sectional view of the membrane switch of FIG. 1.

A membrane switch of the present invention is substantially the same in general construction as the foregoing conventional membrane switch. Referring to FIGS. 1 and 2, the membrane switch of the present invention generally comprises a switching unit 24 and an output flat cable 25. The switching unit 24 is formed by placing an upper sheet 21 over a lower sheet 22 with a spacer 23 therebetween. The output flat cable 25 is held between the upper sheet 21 and the lower sheet 22. An upper contact 26 and lower contacts 27 are formed respectively in the functional surfaces of the upper sheet 21 and the lower sheet 22. The upper contact 26 is connected to an upper terminal 28 formed also in the functional surface of the upper sheet 21. The lower contacts 27 are connected respectively to lower terminals 29 formed in the functional surface of the lower sheet 22.

The output flat cable 25 has a base film 32. Formed in the same surface of the base film 32 are a leader line 30 to be connected to the upper terminal 28, and leader lines 31 to be connected respectively to the lower terminals 29. The free end of the base film 32 is folded so that the leader lines 31 extending in the folded portion are in contact respectively with the lower terminals 29 when the output flat cable 25 is held between the upper sheet 21 and the lower sheet 22. The leader line 30 terminates before the folding line, so that the leader line 30 is in contact only with the upper terminal 28 when the output flat cable 25 is held between the upper sheet 21 and the lower sheet 22.

Figure 3:
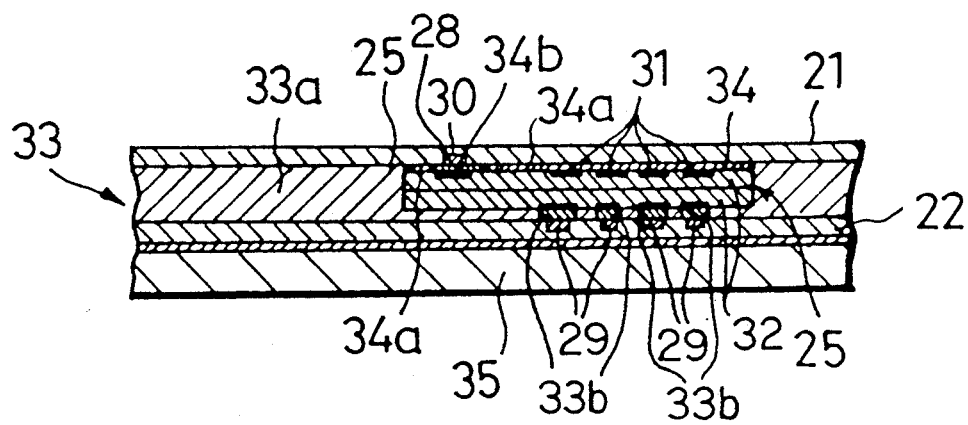
FIG. 3 is a sectional view taken on line III—III in FIG. 2.
Figure 5:
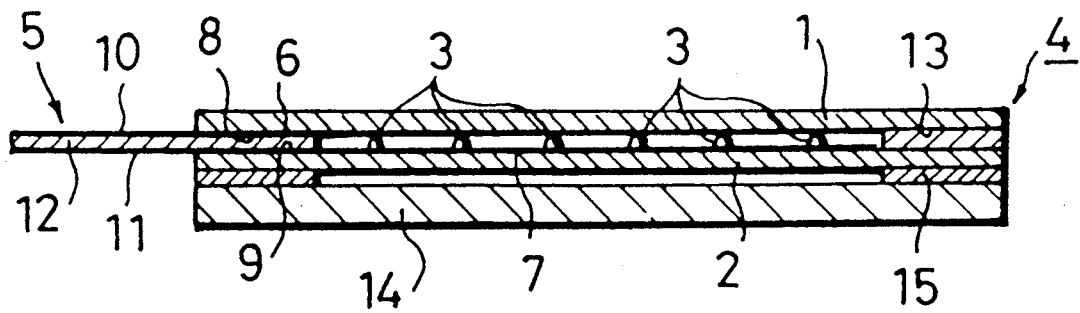
FIG. 5 is a sectional view of the membrane switch of FIG. 4.
Figure 4:
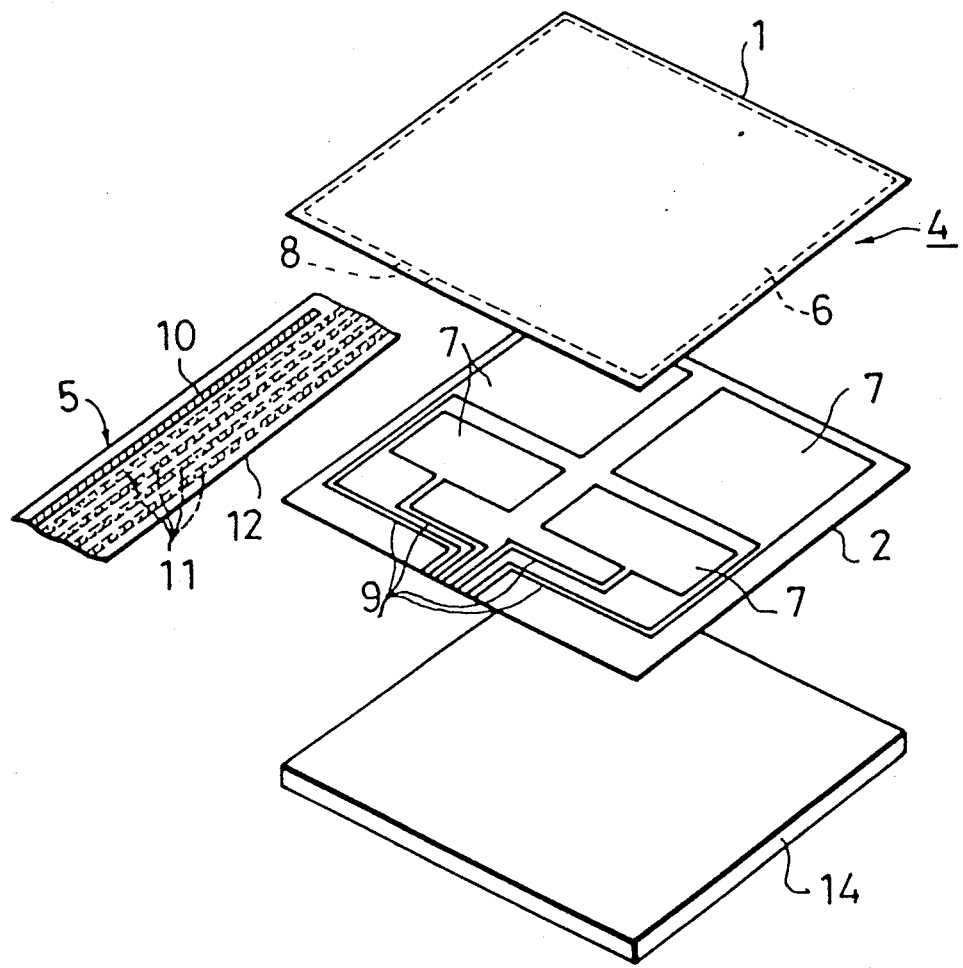
FIG. 4 is an exploded perspective view of a conventional membrane switch.

Referring to FIG. 3, a heat sealing layer 33 is formed over the periphery of the functional surface of the lower sheet 22 facing the upper sheet 21. The heat sealing layer 33 has an insulating heat sealing film 33a formed of an electrically insulating heat sealing material such as a thermoplastic resin containing electrically insulating silica particles, and a conductive heat sealing film 33b formed of an electrically conductive heat sealing material such as a thermoplastic resin containing electrically conductive particles. The insulating heat sealing film 33a is formed over the entire periphery of the functional surface of the lower sheet 22 excluding portions in which the lower terminals 29 are formed respectively. The conductive heat sealing film 33b is formed over the lower terminals 29. The lower terminals 29 are electrically connected respectively to the leader lines 31 through the conductive heat sealing film 33b. Most portion of the insulating heat sealing film 33a is formed in a comparatively large thickness to provide a predetermined space between the upper sheet 21 and the lower sheet 22, while a portion of the insulating heat sealing film 33a corresponding to an area in which the output flat cable 25 is attached, and the conductive heat sealing film 33b are formed in a comparatively small thickness to provide a recess for receiving the free end of the output flat cable 25.

A heat sealing layer 34 is formed over the periphery of the functional surface of the upper sheet 21 facing the lower sheet 22. The heat sealing layer 34 has an insulating heat sealing film 34a formed over the entire periphery of the functional surface of the upper sheet 21 excluding a portion corresponding to the terminal 28, and a conductive heat sealing film 34b formed over the upper terminal 28. The upper terminal 28 is connected electrically through the conductive heat sealing film 34b to the leader line 30 of the output flat cable 25.

The membrane switch assembly thus constructed is mounted on a base plate 35, such as an acrylic plate or a glass plate, and the lower sheet 22 is attached to the base plate 35 by suitable means such as heat sealing.

The insulating heat sealing film 33a, the conductive heat sealing film 33b, the insulating heat sealing film 34a and the conductive heat sealing film 34b are formed, for example, by screen printing. The output flat cable 25 and the upper sheet 21 are placed correctly on the lower sheet 22, and then the assembly of the upper sheet 21, the lower sheet 22 and the output flat cable 25 is heated under pressure to join together the upper sheet 21, the lower sheet 22 and the output flat cable 25 simultaneously. A desired space is formed between the upper sheet 21 and the lower sheet 22 by the heat sealing layer 33 having a predetermined thickness.

Since the membrane switch assembly is attached fixedly to the base plate 35 by a heat sealing material, and the upper sheet 21, the lower sheet 22 and the output flat cable 25 are joined together by the heat sealing layers without using any two-side adhesive tape, the membrane switch can easily be assembled without requiring any troublesome work for peeling the separating paper from a two-side adhesive tape.

The heat sealing layer 33 may be formed on the upper sheet 21 instead of the lower sheet 22 and, if necessary, heat sealing layers 33 and 34 may be formed on both the upper sheet 21 and the lower sheet 22. The heat sealing layer 34 having the insulating heat sealing film 34a and the conductive heat sealing film 34b, formed on the upper sheet 21 may be substituted by an adhesive layer having an insulating adhesive film and a conductive adhesive film. The conductive heat sealing films 33b and 34b may be formed in the output flat cable 25.

In this embodiment, the leader line 30 to be connected to the upper terminal 28, and the leader lines 31 to be connected respectively to the lower terminals 29 are formed in the same surface of the base film 32, and the free end of the base film 32 is folded so that the leader line 30 is connected to the upper terminal 28, and the leader lines 31 are connected respectively to the lower terminals 29. However, the free end of the base film 32 need not be folded when the leader line 30 and the leader lines 31 need not be formed in the same surface of the base film 32.

As apparent from the foregoing description, according to the present invention, a heat sealing layer is formed at least in the periphery of either the upper sheet or the lower sheet of the switching unit, the upper sheet, the lower sheet and the output flat cable are joined together simultaneously without using any two-side adhesive tape which requires a troublesome work for peeling the separating paper. Thus, the membrane switch of the present invention can very easily be assembled.

Although the invention has been described in its preferred form with a certain degree of particularity, obviously many changes and variations are possible therein. It is therefore to be understood that the present invention may be practiced otherwise than specifically described herein without departing from the scope and spirit thereof.

What is claimed is:

1. A membrane switch comprising:
    a switching unit have a pair of sheeted connected together with the respective inner surfaces thereof provided with contacts facing each other and spaced apart by a spacer placed therebetween, and provided with electrical terminals formed in said sheets and connected to the contacts; and
    an output flat cable having leader lines formed on the same surface of a base film, said output flat cable being held between the pair of sheets so that the leader lines are electrically connected respectively to the terminals formed in the pair of sheets;

wherein a connecting layer is formed at least over the periphery of the inner surface of one of the pair of sheets to connect together the pair of sheets with the output flat cable held between the pair of sheets, portions of the connecting layer respectively corresponding to the terminals are formed respectively of films of an electrically conductive material, and portions of the connecting layer other than those corresponding to the terminals are formed respectively of films of an electrically insulating material, said connecting layer and its said electrically insulating material and said electrically conductive material surround said output flat cable to provide an interconnection of said output flat cable leader lines to said terminals of said sheets.

2. A membrane switch according to claim 1, wherein one of said contacts is formed over the entire inner surface of one of said pair of sheets, the rest of said contacts are formed on the inner surface of the other sheet, one of said terminals is formed on the inner surface of said one sheet so as to be connected to the contact formed over the entire inner surface of said one sheet, the rest of said terminals are formed on the inner surface of said other sheet so as to be connected to said terminals formed on the surface of said other sheet, the free end of the base film of said output flat cable is folded one of said leader lines to be connected to the terminal of said one sheet terminates before the folding line of the base film, the rest of the leader lines are extended to the extremity of the base film, and said output flat cable is held between the pair of sheets with the leader line terminating before the folding line in electrical contact with the terminal of said one sheet and with the rest of the leader lines in electrical contact respectively with the terminals of the latter sheet.

3. A membrane switch according to claim 1, wherein said connecting layer is formed by printing, said electrically conductive material is a thermoplastic synthetic resin containing particles of an electrically conductive material, and said electrically insulating material is an insulating thermoplastic synthetic resin.

4. A membrane switch according to claim 1, wherein said connecting layer is formed by printing, said electrically conductive material is an electrically conductive adhesive, and said electrically insulating material is an electrically insulating adhesive.

* * * * *

UNITED STATES PATENT AND TRADEMARK OFFICE
CERTIFICATE OF CORRECTION

PATENT NO.    :   5,001,308
DATED         :   March 19, 1991
INVENTOR(S)   :   Mori Kouichirou It is certified that error appears in the above-identified patent and that said Letters Patent is hereby corrected as shown below:

Column 4, line 58 delete "sheeted" and insert --sheets--.

Signed and Sealed this

Twenty-second Day of December, 1992

Attest:

DOUGLAS B. COMER

*Attesting Officer*     *Acting Commissioner of Patents and Trademarks*